United States Patent [19]

Inaishi

[11] Patent Number: 5,275,917
[45] Date of Patent: Jan. 4, 1994

[54] PHOTOCURABLE COMPOSITION

[75] Inventor: Kouji Inaishi, Okazaki, Japan

[73] Assignee: Brother Kogyo Kabushiki Kaisha, Nagoya, Japan

[21] Appl. No.: 900,140

[22] Filed: Jun. 18, 1992

[30] Foreign Application Priority Data

Jul. 9, 1991 [JP] Japan .................. 3-168404

[51] Int. Cl.⁵ .................................. G03C 1/68
[52] U.S. Cl. .................................. 430/288; 430/281; 430/914; 522/25; 522/26
[58] Field of Search .......... 522/25, 26; 430/281, 430/288, 914, 913, 915

[56] References Cited

U.S. PATENT DOCUMENTS

| | | | |
|---|---|---|---|
| 2,588,899 | 3/1952 | Tonnis et al. | 524/213 |
| 3,418,118 | 12/1968 | Thommes et al. | 430/281 |
| 3,479,185 | 11/1969 | Chambers, Jr. | 430/278 |
| 3,495,987 | 2/1970 | Moore | 430/288 |
| 5,147,758 | 9/1992 | Smothers et al. | 522/25 |
| 5,219,709 | 6/1993 | Nagasaka et al. | 430/281 |

FOREIGN PATENT DOCUMENTS

| | | |
|---|---|---|
| 52-134692 | 11/1977 | Japan . |
| 54-151024 | 11/1979 | Japan . |
| 57-21401 | 2/1982 | Japan . |
| 58-19315 | 2/1983 | Japan . |
| 58-29803 | 2/1983 | Japan . |
| 58-40302 | 9/1983 | Japan . |
| 59-56403 | 3/1984 | Japan . |
| 60-228448 | 11/1985 | Japan . |
| 61-143370 | 7/1986 | Japan . |
| 61-145143 | 7/1986 | Japan . |
| 61-167680 | 7/1986 | Japan . |
| 61-218550 | 9/1986 | Japan . |
| 61-218551 | 9/1986 | Japan . |
| 61-238755 | 10/1986 | Japan . |
| 61-243862 | 10/1986 | Japan . |
| 61-258802 | 11/1986 | Japan . |
| 61-258803 | 11/1986 | Japan . |
| 54260038 | 11/1986 | Japan . |
| 62-432 | 1/1987 | Japan . |
| 62-465 | 1/1987 | Japan . |
| 1-146842 | 6/1989 | Japan . |
| 1-146845 | 6/1989 | Japan . |
| 1-146846 | 6/1989 | Japan . |
| 1-146847 | 6/1989 | Japan . |
| 1-146851 | 6/1989 | Japan . |
| 1-146864 | 6/1989 | Japan . |
| 1-228960 | 9/1989 | Japan . |
| 1-228961 | 9/1989 | Japan . |
| 1-230674 | 9/1989 | Japan . |

*Primary Examiner*—Jack P. Brammer
*Attorney, Agent, or Firm*—Oliff & Berridge

[57] ABSTRACT

A photocurable composition comprises a radical polymerizable unsaturated group-bearing compound, a metal allene compound, and a squalilium compound. The composition is cured by application of low energy visible light or near infrared light having a long wavelength. In the composition, the metal allene compound and the squalilium dye serve as photopolymerization initiators, which are able to produce radicals by application of the long wavelength light and to polymerize the radical polymerizable unsaturated group-bearing compound.

5 Claims, No Drawings

PHOTOCURABLE COMPOSITION

BACKGROUND OF THE INVENTION

1. Field of the Invention

This invention relates to a photocurable composition which is adapted for use as a photoresist or in image recording and which undergoes a curing reaction at high sensitivity by application of visible light or near infrared light.

2. Description of the Related Art

Hitherto known photocurable compositions which have high sensitivity to visible light are those which comprise the following types of initiators, e.g., composite initiators of dyes and aliphatic amines (Japanese Patent Publication No. Sho 44-20189), initiators of hexaarylbiimidazoles, radical generators and dyes (Japanese Patent Publication No. Sho 45-37377), initiators of hexaarylbiimidazoles and p-dialkylaminobenzylidene ketones (Japanese Patent Laid-open No. Sho 47-2528), initiators of cyclic-cis-α-dicarbonyl compounds and dyes (Japanese Patent Laid-open No. Sho 48-84183), initiators of carbonyl compounds and tertiary amines (Japanese Patent Laid-open No. Sho 52-134692), initiators of substituted triazines and merocyanine dyes (Japanese Patent Laid-open No. Sho 54-151024), initiators of biimidazoles and indanones (Japanese patent Laid-open No. Sho 54-155292), initiators of hexaarylbiimidazoles and p-dialkylaminostilbene derivatives (Japanese Patent Laid-open No. Sho 57-21401), initiators of hexaarylbiimidazoles and p-dialkylaminocinnamylidene derivatives (Japanese Patent Laid-open No. Sho 58-19315), initiators of triazine derivatives and Cyanine dyes (Japanese Patent Laid-open No. Sho 58-29803), initiators of triazine derivatives and thiapyrylium salts (Japanese Patent Laid-open No. Sho 58-40302), initiators of hexaarylbiimidazoles and n-dialkylstilbene derivatives or p-dialkylaminophenylbutadienyl derivatives and thiole compounds (Japanese Patent Laid-open No. Sho 59-56403), initiators of ketone-substituted derivatives and organic peroxides (Japanese Patent Laid-open No. Sho 60-32801), initiators of α-diketones and mercapto carboxylic acids (Japanese Patent Laid-open No. Sho 61-258802), initiators of α-diketones and polysulfides (Japanese Patent Laid-open No. Sho 61-258803) and the like.

The curing with visible light with a long wavelength has been reported as follows.

According to the Japanese Patent Publication No. Sho 44-20189, the degree of the curing is expressed in terms of a relative minimum exposure.

Relative minimum exposure = I × t where I is an intensity of the light and t is a time before commencement of polymerization, and log I = log 100 − D where the value of 100 is an intensity of carbon arc light for convenience's sake and D is a wedge density. Thus, I = antilong (2−0.05n)

wherein n is the number of polymerization steps.

The relative minimum exposure of photocurable compositions in the Publication No. Sho 44-20189 is 31.7 for a composition having a maximum absorption wavelength of 430 nm, 63.1 for a composition having a maximum absorption wavelength of 575 nm, and 1000 for a composition having a maximum absorption wavelength of 680 nm. More particularly, the photocurable composition set out in the Publication No. Sho 44-20189 requires greater energy since it is cured at a longer wavelength.

In the Japanese Patent Laid-open No. Sho 58-29803, the degree of curing is indicated by the use of stepped tablets. According to the invention disclosed in Laid-Open No. Sho 58-29803, there is obtained a photocurable composition with a maximum of twelve steps of sensitivity by irradiation with light at 436 nm for 60 seconds, a photocurable composition with a maximum of eight steps of sensitivity by irradiation with light at 490 nm for 60 seconds, and a photocurable composition with a maximum of six steps of sensitivity by irradiation with light at 600 nm for 120 seconds. More particularly, since the compositions are cured with long wavelength visible light, greater energy is required.

For practical use, there is a high demand for photocurable compositions which are able to be cured at lower energy. Especially, there is a demand for a photocurable composition which is cured by application of long wavelength visible light or near infrared light at a similar low level of energy as that required by a photocurable composition capable of being cured with visible light having a shorter wavelength.

SUMMARY OF THE INVENTION

The invention addresses the above problems observed in the prior art. It is an object of the invention to provide a photocurable composition which is cured at low energy of long wavelength visible light or near infrared light.

According to the invention, there is provided a photocurable composition which comprises a radical polymerizable unsaturated group-bearing compound, a metal allene compound and a squalilium dye.

PREFERRED EMBODIMENTS OF THE INVENTION

The radical polymerizable unsaturated group-bearing compounds used in the invention include, for example, N-vinyl-2-pyrolidone, bisphenol A diacrylate and dimethacrylate, tripropylene glycol diacrylate and dimethacrylate, pentaerythritol triacrylate and trimethacrylate, dipentaerythritol hexaacrylate and hexamethacrylate, and trimethylolpropane triacrylate and trimethacrylate. These radical polymerizable unsaturated group-bearing compounds may be used singly or in combination.

The metal allene compounds used as the photopolymerization initiator are, for example, ones having the structure of the following formula:

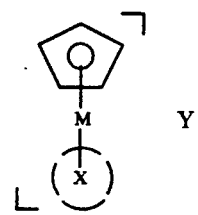

Formula 1 wherein X represents a group containing at least one benzene ring, Y represents a basic ion such as BF4-, PF6-, AsF6- and SbF6-, and M represents a metal such as iron, nickel and cobalt.

The squalilium dyes are those set forth, for example, in Japanese Patent Laid-open Nos. Sho 48-22443, 60-136542, 60-174750, 60-228448, 61-143370, 61-145143, 61-167680, 61-167681, 61-218550, 61-218551, 61-238755, 61-243862, 61-260038, 62-432 and 62-465 and Nos. Hei 1-146842, 1-146844, 1-146845, 1-146846, 1-146847, 1-146851, 1-146864, 1-228960, 1-228961 and 1-230674, and Japanese Patent Publication No. Hei 2-19858. Of these, preferred squalilium dyes are those having the following structure:

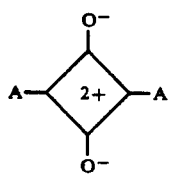

Formula 2 wherein each A represents a substituted or unsubstituted condensed ring, a methylene group double bonded with a substituted or unsubstituted heterocyclic ring, or a substituted or unsubstituted aminophenol group.

More specifically, the dyes of the following formulas are mentioned.

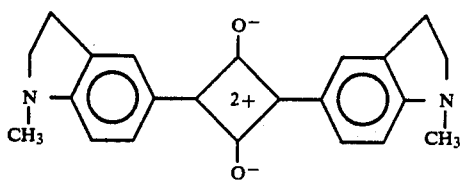

Formula 3

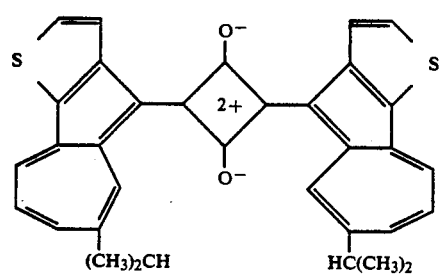

Formula 4

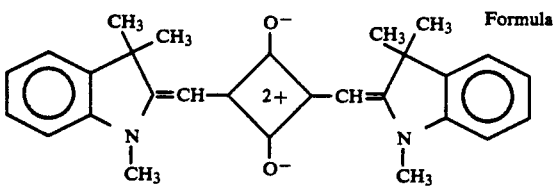

Formula 5

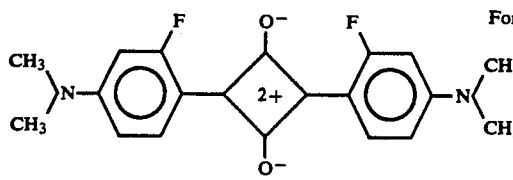

Formula 6

If necessary, the photocurable composition may further comprise thermal polymerization inhibitors, sensitizers, surface active agents, solvents, and dyes and pigments provided that they do not inhibit or negatively affect the photosensitive characteristics of the photocurable composition.

The mechanism of the curing reaction of the photocurable composition according to the invention is not fully understood, but is considered as follows.

The squalilium dye absorbs light and is excited. When the excited squalilium dye is returned to the ground state, the metal allene compound is activated by movement of electrons or energy released. The activated metal allene compound contributes to the radicalization of the radical polymerizable unsaturated group-bearing compound The resultant radicals cause the radical polymerizable unsaturated group-containing compound to be polymerized.

Most preferably, the composition of the invention comprises a mixture of polyethylene glycol diacrylate and pentaerythritol hexaacrylate, a metal allene compound of the following formula:

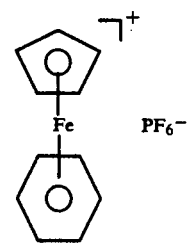

Formula 7 and a squalilium dye of the following formula:

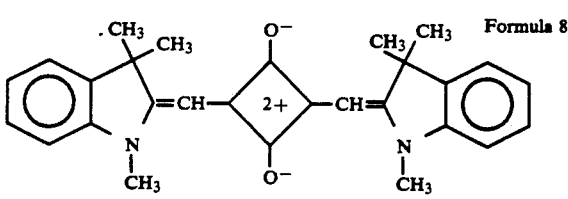

Formula 8

The composition should preferably comprise 100 parts by weight of a radical polymerizable unsaturated group-bearing compound, from 1 to 40 parts by weight of a metal allene compound, and from 0.05 to 20 parts by weight of a squalilium dye.

The present invention is more particularly described by way of example.

EXAMPLE 10 g of polyethylene glycol diacrylate: pentaerythritol hexaacrylate (7:12), 1.5 g of metal allene compound of the following formula:

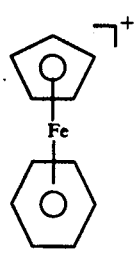

Formula 7

PF6-, and 0.5 g of squalilium dye of the following formula

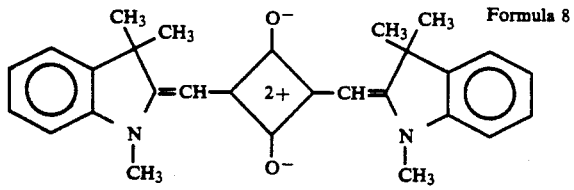

Formula 8

The above ingredients were mixed and ultrasonically dispersed. The resultant dispersion was heated at 100° C. and kneaded to obtain a photocurable composition. The composition was applied onto a 50 μm thick polyester film by the use of a bar coater and the applied side was covered with a similar polyester film to obtain a sample. The sample was exposed to light and cured, by means of a spectral sensitometer, to determine curing energy for a curing height at the maximum wavelength for the curing, irradiation energy from a light source at the wavelength, and an exposure time. At the maximum wavelength for the curing of about 630 nm, the curing energy was 5213.01 erg/cm2.

When the maximum wavelength was about 430 nm, the curing energy was found to be 4000 erg/cm2. From this, it will be seen that when using visible light having a long wavelength, the composition can be cured by application of substantially the same energy as in the case of visible light having a short wavelength.

The general procedure of the above example was repeated using a photocurable composition as set forth in Japanese Patent Laid-open No. Sho 58-29803 to measure the curing energy. As a result, it was found that the curing did not take place at a maximum wavelength for the curing greater than 600 nm unless additional energy was applied.

As will be apparent from the foregoing, the photocurable composition of the invention is cured at low energy by the use of long wavelength visible light or near infrared light since the sensitization at long wavelengths is facilitated by means of the metal allene compound and the squalilium dye. Thus, a low output power light source such as a He-Ne laser can be used with the photocuring time being shortened.

What is claimed is:

1. A photocurable composition which comprises a radical polymerizable unsaturated group-bearing compound, a metal allene compound and a squalilium dye, whereby said composition is cured by application of visible light or near infrared light having a long wavelength.

2. The photocurable composition according to claim 1, wherein said metal allene compound is used in an amount of from 1 to 40 parts by weight and said squalilium dye is used in an amount of from 0.05 to 20 parts by weight, both per 100 parts by weight of the radical polymerizable unsaturated group-bearing compound.

3. The photocurable composition according to claim 1, wherein said radical polymerizable unsaturated group-bearing compound is a mixture of polyethylene glycol diacrylate and pentaerythritol hexaacrylate.

4. The photocurable composition according to claim 1, wherein said metal allene compound is of the following formula:

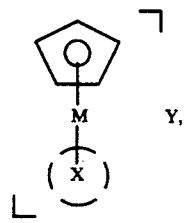

wherein X represents a group containing at least one benzene ring, Y is a basic ion, and M is a metal selected from iron, nickel and cobalt.

5. The photocurable composition according to claim 1, wherein said squalilium dye is of the following formula:

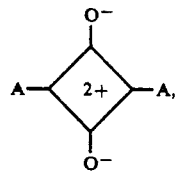

wherein each A represents a substituted or unsubstituted condensed ring, a methylene group double bonded with a substituted or unsubstituted heterocyclic ring or a substituted or unsubstituted aminophenol group.

* * * * *

UNITED STATES PATENT AND TRADEMARK OFFICE
CERTIFICATE OF CORRECTION

PATENT NO. : 5,275,917
DATED : January 4, 1994
INVENTOR(S) : Kouji INAISHI

It is certified that error appears in the above-indentified patent and that said Letters Patent is hereby corrected as shown below:

TITLE PAGE

[56] Foreign Patent Documents, add the following:
```
    44-20189   08/1969  Japan
    45-37377   11/1970  Japan
    47-2528    02/1972  Japan
    48-84183   11/1973  Japan
    54-155292  12/1979  Japan
    60-32801   02/1985  Japan
    44-20189   08/1969  Japan
    48-22443   03/1973  Japan
    60-136542  07/1985  Japan
    60-174750  09/1985  Japan
    61-167681  07/1986  Japan
     2-19858   05/1990  Japan
```
[57]   Line 3, change "allene" to --arene--, change "squalilium" to --squarylium--;
       line 6, change "allene" to --arene--,
       line 7, change "squalilium" --squarylium--.
Col. 1, line 63, change "antilong" to --antilog--.
Col. 2, line 39, change "allene" to --arene--, change "squalilium" to --squarylium--;
       line 53, change "allene" to --arene--.
Col. 3, line 3, change "squalilium" to --squarylium--;
       line 11, change "squalilium" to --squarylium--.
Col. 4, line 6, change "squalilium" to --squarylium--;
       line 7, change "squalilium" to --squarylium--;
       line 8, change "allene" to --arene--;
       line 10, change "allene" to --arene--;
       line 17, change "allene" to --arene--;
       line 32, change "squalilium" to --squarylium--.
       line 45, change "allene" to --arene--;
       line 46, change "squalilium" to --squarylium--;

UNITED STATES PATENT AND TRADEMARK OFFICE
CERTIFICATE OF CORRECTION

PATENT NO. : 5,275,917

DATED : January 4, 1994

INVENTOR(S) : Kouji INAISHI

It is certified that error appears in the above-indentified patent and that said Letters Patent is hereby corrected as shown below:

Col. 4, line 54, change "allene" to --arene--;
       line 68, change "squalilium" to --squarylium--.

Col. 5, line 41, change "allene" to --arene--;
       line 42, change "squalilium" to --squarylium--.

Column 5, line 48, change "allene" to --arene--, change "squalilium" to --squarylium--.

Column 6, line 4, change "allene" to --arene--;
Column 6, line 6, change "squalilium" to --squarylium--.

Column 6, line 15, change "allene" to --arene--.
Column 6, line 23, formula, change "Y," to --Y--.

Column 6, line 32, change "squalilium" to --squarylium--.

Signed and Sealed this

Twelfth Day of July, 1994

Attest:

BRUCE LEHMAN

*Attesting Officer*      Commissioner of Patents and Trademarks